United States Patent [19]
Kobayashi et al.

[11] Patent Number: 5,724,601
[45] Date of Patent: Mar. 3, 1998

[54] SWITCHING STATE DETECTING APPARATUS, CONTROL UNIT AND TRANSMISSION UNIT FOR WAKING UP A MICROCOMPUTER

[75] Inventors: Ryoichi Kobayashi, Naka-gun; Noboru Sugiura, Mito, both of Japan

[73] Assignee: Hitachi, Ltd., Tokyo, Japan

[21] Appl. No.: 673,785

[22] Filed: Jun. 11, 1996

Related U.S. Application Data

[63] Continuation of Ser. No. 492,967, Jun. 21, 1995, abandoned, which is a continuation of Ser. No. 852,373, Mar. 13, 1992, abandoned.

[30] Foreign Application Priority Data

Mar. 19, 1991 [JP] Japan ..................... 3-054347

[51] Int. Cl.$^6$ ..................................... H03K 3/00
[52] U.S. Cl. .......................... 395/800; 307/106
[58] Field of Search ..................... 395/800, 180; 307/106

[56] References Cited

U.S. PATENT DOCUMENTS

| | | | |
|---|---|---|---|
| 3,984,773 | 10/1976 | Oda | 324/166 |
| 4,338,529 | 7/1982 | Fujibayashi | 307/518 |
| 4,668,875 | 5/1987 | Miyazaki et al. | 307/106 |
| 4,768,191 | 8/1988 | Polcer | 370/112 |
| 5,005,427 | 4/1991 | Ohmae | 73/861.22 |
| 5,059,825 | 10/1991 | Yoshida | 307/448 |
| 5,159,213 | 10/1992 | Johnson | 307/443 |
| 5,170,076 | 12/1992 | Smith | 307/354 |

FOREIGN PATENT DOCUMENTS

| | | |
|---|---|---|
| 3611956 | 10/1986 | Germany . |
| 56-048714 | 5/1981 | Japan . |
| 11-168116 | 10/1989 | Japan . |
| 2095015 | 9/1982 | United Kingdom . |

*Primary Examiner*—Alyssa H. Bowler
*Assistant Examiner*—Walter D. Davis
*Attorney, Agent, or Firm*—Ladas & Parry

[57] ABSTRACT

A switching state detecting apparatus capable of preventing output voltage hunting caused by mechanical switch contacts bouncing when changing state and creating voltage fluctuation (chatter) comprises a passive filter connected to the switches and a comparator for comparing the output value of the RC filter with a threshold level to then output a voltage value. The comparator changes the threshold level when the output voltage of the comparator is inverted, thereby preventing the apparatus from hunting. The output of the comparator is potentially divided and the divided output potential is superposed onto an initial threshold level to provide a second threshold level exceeding the voltage chatter level of said switches.

7 Claims, 9 Drawing Sheets

SWITCHING STATE DETECTING APPARATUS, CONTROL UNIT AND TRANSMISSION UNIT FOR WAKING UP A MICROCOMPUTER

This application is a continuation of application Ser. No. 08/492,967 filed on Jun. 21, 1995, now abandoned which is a continuation of Ser. No. 07/852,373 filed on Mar. 13, 1992 (now abandoned).

BACKGROUND OF THE INVENTION

1. Field of the Invention

The present invention relates to a switching state detecting apparatus for detecting the switching state of a switching means, a control unit for connecting the output of the switching state detecting apparatus to an interrupt terminal of a microcomputer, and a transmission unit for communicating with other control units using the control unit.

2. Description of the Related Art

Normally, on and off states of a mechanical switch are converted into electrical signals for control purposes. In other words, it has heretofore been arranged that, for example, a relatively high voltage is output when the mechanical switch is in the OFF state and a relatively low voltage is output when the switch is in the ON state. A pull-up or pull-down resistor is used for electrically detecting the switching state of such a mechanical switch as disclosed in, for instance, Japanese Patent Laid-Open No. 137038/1988.

Because of switch contact bounce when the switch position is changed, the pull-up or pull-down resistor used to detect the switching state of such a mechanical switch, alternately outputs relatively high and low voltages over a short time interval when the mechanical switch is changed from, for example, an OFF to an ON state. After contact bounce is overcome, the output stabilizes and the relatively low voltage is output thenceforth.

If the switching state detecting apparatus produces an output which oscillates about a desired value, that is the output "hunts" when the mechanical switch is turned ON, the stability of a control unit using the switching state detecting apparatus will be impaired.

A first object of the present invention is to provide a switching state detecting apparatus capable of preventing output voltage hunting when a mechanical switch is changed from one state to another, for example, an OFF to an ON state.

It is well known that the output of a switching state detecting apparatus may be supplied via an I/O buffer or the like to a microcomputer to have the microcomputer perform operations according to software in order to control an object to be controlled. In such a case, even though hunting occurs in the output of the switching state detecting apparatus, it is, in practice, removable through filtering by means of the software.

However, the hunting produced from the switching state detecting apparatus is not removable by means of the software if the output of the switching state detecting apparatus is connected to the interrupt terminal of the microcomputer for making the microcomputer perform operations in dependence upon the output signal from the switching state detection apparatus. As a result, the microcomputer may malfunction because of the hunting voltage generated by the switching state detecting apparatus and, further, the hunting voltage may involve some risk in damaging the microcomputer.

In a feature, a second object of the present invention is to provide a control unit capable of controlling a microcomputer stably without malfunction even when the control unit controls the microcomputer by supplying the output of a switching state detecting apparatus to the interrupt terminal of the microcomputer.

It is also well known that the output of a switching state detecting apparatus may be supplied to the interrupt terminal of a microcomputer and, when a communication means for communicating with other control units is provided, to simultaneously supply a signal to the interrupt terminal of the microcomputer when transmission is directed from some other control unit. If hunting accompanies the output of the switching state detecting means, in this case, the microcomputer will find difficulty in being able to fetch data from that control unit.

In another feature, a third object of the present invention is to provide a transmission unit capable of ensuring that a microcomputer fetches transmission data from other control units.

SUMMARY OF THE INVENTION

According to one aspect of this invention there is provided a switching state detecting apparatus comprising switching means for selectively outputting a first voltage value or a second voltage value, a passive filter connected to the output of said switching means, and comparator means for comparing the output value of said passive filter with a predetermined reference voltage value and for providing a bi-state output, said comparator means changing said reference voltage value from a first threshold value to a second threshold value when the output voltage of said comparator means changes from one state to another state to thereby prevent the comparator means output voltage hunting.

According to another aspect of this invention there is provided a switching state detecting apparatus comprising switching means producing contact bounce when changing state resulting in switching means output voltage fluctuation, a passive filter connected to receive the output of said switching means, and a comparator means for comparing the output of said passive filter with a first threshold level and providing a bi-state output voltage in dependence thereon, said comparator means changing said first threshold level to a second threshold level when the output voltage thereof changes state, said first and second threshold levels being spaced apart by in excess of the output voltage fluctuation of said switching means.

In a feature of this invention, in order to accomplish the second object, a control unit comprises, in addition to the constitution of the invention given above, a microcomputer having an interrupt signal input (IRQ) connected to receive the output of said comparator means for control thereby.

In another feature of this invention, in order to accomplish the third object, the transmission unit comprises, in addition to the constitution of the feature given above, a communication means for serially communicating with other control units via a multiplex transmission line, said communication means having means for deciding that reception has been made and for sending an acknowledgement signal to said interrupt signal input, and said microcomputer assumes control of a controlled element in response to said interrupt signal.

With the present invention, the hunting voltage produced when the mechanical switch is changed from an OFF to an ON state is passively filtered, for example, through the RC filter. The first voltage is, thus, gradually changed from a first value to a second value. Although the output voltage of the RC filter is accompanied with a minute voltage fluctuation (chattering), the comparator threshold level changes when the comparator determines the output voltage value of the RC filter exceeds the threshold level. Therefore, the threshold level is changed to overstep the chattering range. As a result, the output of the RC filter is kept from again crossing the threshold level and thus prevents the output of the comparator again changing.

With the feature of the present invention, the voltage free from hunting is applied to the interrupt terminal of the microcomputer when the mechanical switch is changed from an OFF to an ON state. The microcomputer is, thus, prevented from malfunctioning and is stably controlled.

With the another feature of the present invention, the voltage free from hunting is applied to the interrupt terminal of the microcomputer when the mechanical switch is changed from an OFF to an ON state. Consequently, the signal which the communication means applies to the interrupt terminal of the microcomputer on receiving data is not impaired. The data transmission is, thus, carried out precisely.

BRIEF DESCRIPTION OF THE DRAWINGS

The invention will now be described, by way of example, with reference to the accompanying drawings in which.

In the Figures like reference numerals denote like parts.

DESCRIPTION OF THE PREFERRED EMBODIMENTS

Figure 1:
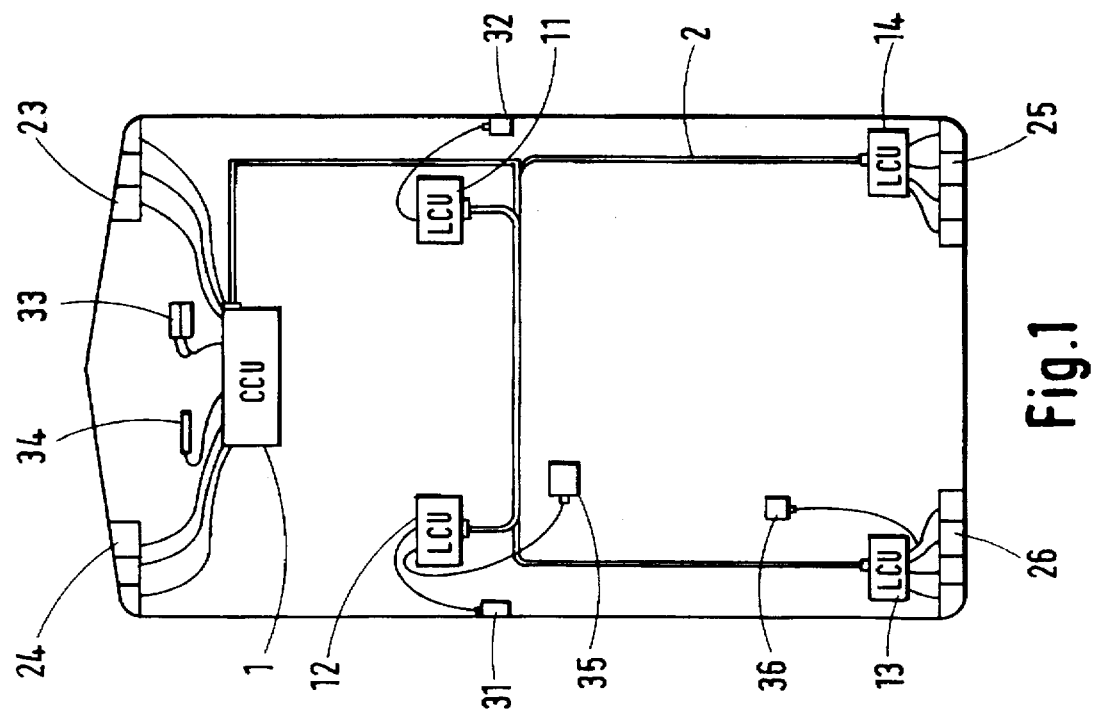
FIG. 1 shows an automotive wiring diagram.

Referring to FIG. 1, a central control unit 1 (hereinafter called "CCU") and local control units 11, 12, 13, 14 (hereinafter called "LCU") are connected via a signal line 2. Moreover, various switches and lamps are individually connected to the CCU 1 and the LCUs 11–14.

The CCU 1 is installed close to an automotive dashboard used for controlling the whole system. As for the LCUs 11–14, these may be any desired number and four are shown as exemplary, and they are disposed near electric apparatus such as switches and lamps, as appropriate.

In the present example, an internal compartment lamp 35 is connected to the LCU 12, door switches 31, 32 to the respective LCUs 12, 11, and a key switch 33 and a rear defogger switch 34 to the CCU 1.

On the other hand, a rear defogger 36 is connected to the LCU 13, head lamps 23, 24 are connected to the CCU 1, and tail lamps 26, 25 to the respective LCUs 13, 14.

Although only switches and lamps are shown in FIG. 1, their use in the present invention is not limited thereto and it is, needless to say, possible to arrange for not only sensors for outputting analog signals but also actuators to be connected to the CCU 1 and the LCUs 11–14.

With respect to control over the wiring described above, it is effected in such a way that, on receiving information about the ON state of the door switch 32 from the LCU 11 or that of the door switch 31 from the LCU 12, for instance, the CCU 1 feeds back the information to the LCU 12 to have the interior lamp 35 lit. On receiving information about the ON states of accessories and ignition, for example, the ON state of the rear defogger switch 34 and the condition of the ignition key switch 33, so the CCU 1 feeds back the information to the LCU 13 to have the rear defogger 30 operating.

Figure 2:
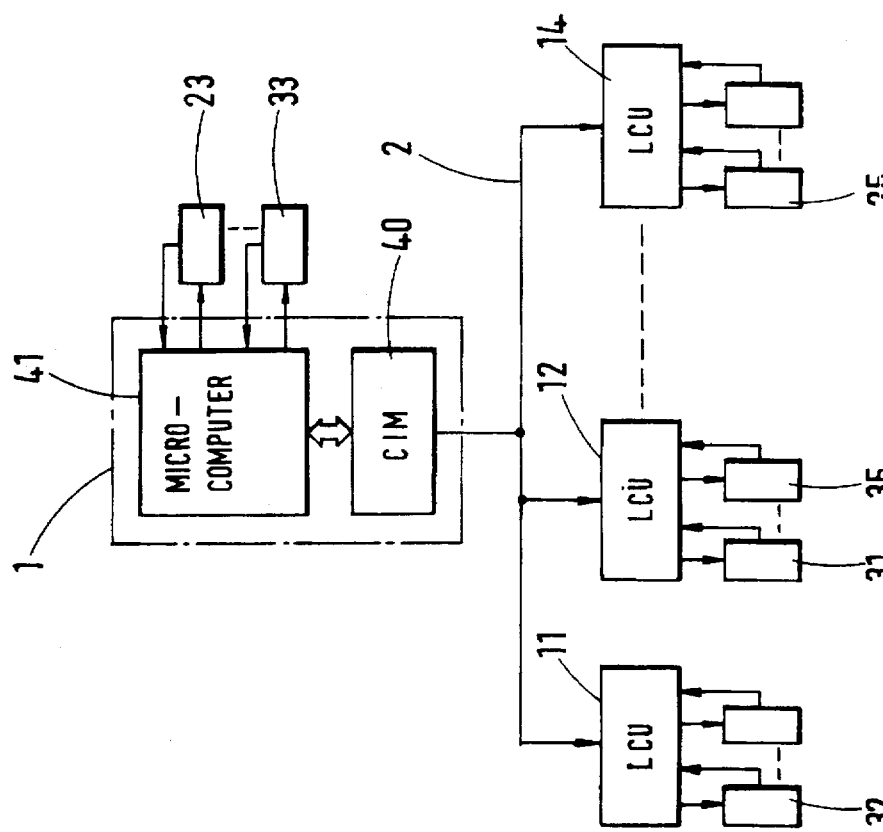
FIG. 2 shows an overall system in block schematic form.

A description will now be given of the control of the whole system by reference to FIG. 2. The CCU 1 consists of a microcomputer 41 and a communication interface adaptor 40 (hereinafter called "CIM"). The CCU 1 receives information about the state of the switch 34 directly or controls the lamp 23 directly. Simultaneously, the CCU 1 receives information about the states of the switches 31, 32 via the LCUs 11–14 by means of communication over transmission line 2 and controls the lamps 25, 35.

The CCU 1 exchanges information with the LCUs 11–14 by communicating with the latter via a multiplex transmission line 2. Any kind of multiplex transmission line 2 suffices as long as it is bidirectional and an optical fiber may be used as well as, or alternatively to, an electrical signals conductor wire. The CCU 1 communicates with the LCUs 11–14 under a so-called half-duplex system.

Figure 3:
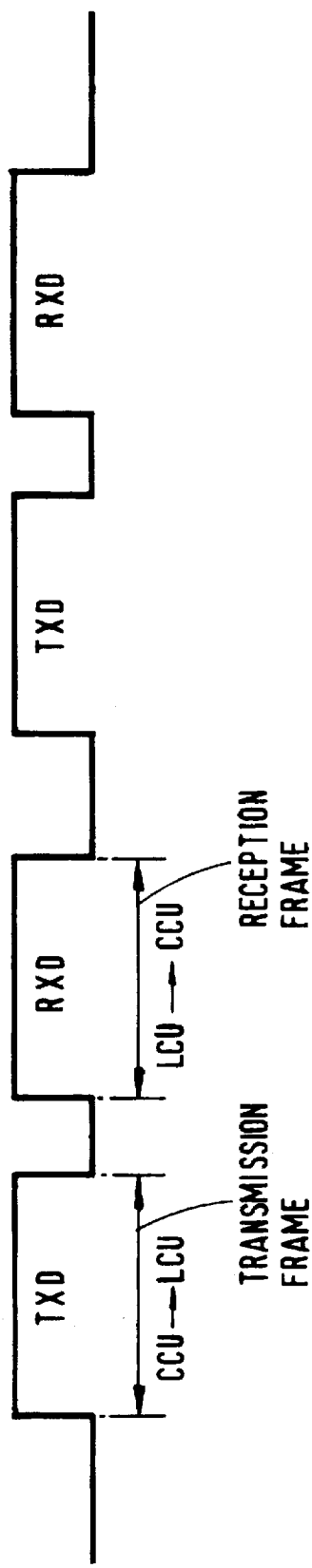
FIG. 3 shows a diagram illustrating signal transfer between the central control unit and a terminal control unit.

FIG. 3 is a diagram illustrating exchange of signals between the CCU 1 and the LCUs 11–14. Firstly, the CCU 1 selects a specific LCU and sends a signal to the multiplex transmission line 2 in order to call the LCU (transmission frame: TXD). In response to the call, the LCU, thus selected, sends a signal to the multiplex transmission line 2 and responds to that call (reception frame: RXD).

The CCU 1 selects particular one of the LCUs 11–14 in sequence and repeats the combination of call and response to effect multiplex transmission.

Figure 4:
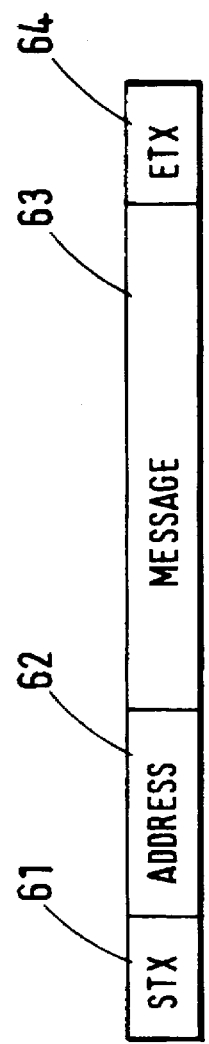
FIG. 4 shows a diagram illustrating a communication signal to be fed to a multiplex transmission line.

FIG. 4 illustrates a communication signal 60 to be sent to the multiplex transmission line. The communication signal 60 is composed of a communication initiating section STX 61, an address 62, transmission data 63 (message), and a transmission terminating section ETX 64. The address 62 has been added so as to represent the destination of the multiplex transmission under the half-duplex system. Each LCU responds only when it recognizes that the address assigned to the data received from the multiplex transmission line 2 conforms to its own address assigned thereto.

In this way, a communication signal with an address assigned thereto is output from the CCU 1 and only one of the LCUs which has recognized and judged the address to be its own responds to the signal and transmits a communication signal to the CCU 1, so that the operation of transmitting data under the half-duplex system is repeated.

Figure 5:
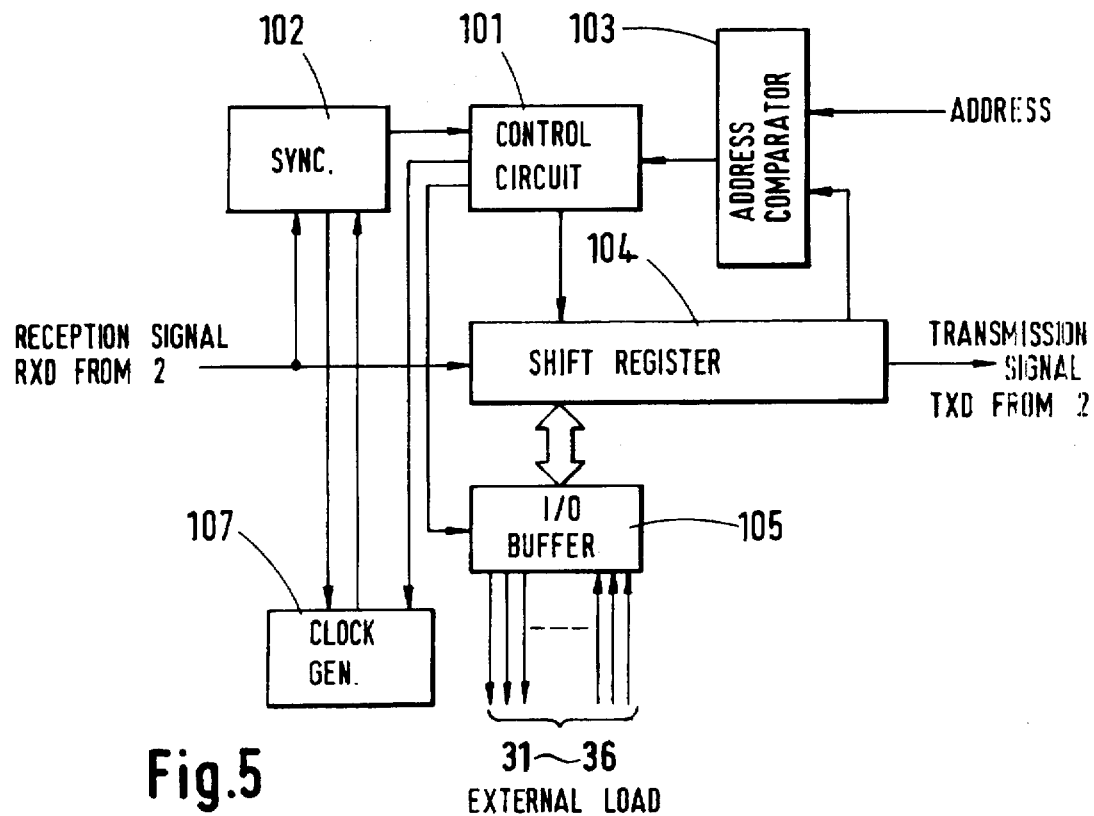
FIG. 5 shows a block diagram illustrating the terminal control unit in detail.

FIG. 5 is a schematic block diagram illustrating one of the LCUs 11–14 by way of example. The reception signal RXD received from the multiplex transmission line 2 is supplied to a synchronizing circuit 102 where the signal is synchronized with a clock pulse from a clock generator 107. Subsequently, a start-stop clock pulse synchronized with the clock component of the reception signal RXD is given to a control circuit 101, whereby the control circuit produces a control signal. The data portion of the reception signal is serially read to a shift register 104.

An address comparator 103 is initially given the address assigned to the LCU involved. This address and the data read to the predetermined bit position of the shift register 104 are compared by the address comparator 103 and only when they conform to one another is the data in the shift register 104 transferred to an I/O buffer 105 before being supplied to external equipment.

Moreover, the control circuit 101 also monitors the reception signal RXD to determine whether to enter a sleep mode. If the data stored in the shift register 104 indicates that the LCU is entering the sleep mode according to the reception signal RXD from the CCU 1, the control circuit 101 works upon the clock generator 107 to suspend clock generator output to thereby avoid draining the system power supply (usually a battery).

If the LCU is in the sleep mode, the LCU is released from the sleep mode upon again receiving the reception signal RXD. The synchronizing circuit 102 keeps examining whether the reception signal RXD exists even after the sleep mode is established. If the reception signal RXD exists when the LCU enters the sleep mode and the clock generator 107 output is suspended, the synchronizing circuit 102 works upon the clock generator 107 to restart the clock generator output. Simultaneously, the synchronizing circuit 102 works upon and notifies the control circuit 101 of the fact that the LCU is controlled in normal condition again.

The control circuit 101 also includes a counter to be incremented step-by-step by a clock pulse, produces a sequential control signal and gives the I/O buffer 105 data according to the reception signal RXD. Subsequently, the control circuit 101 fetches data, from the I/O buffer 105 to the shift register 104 in parallel, and prepares in the shift register 104 data to be transferred from the external equipment to the CCU 1 as serial data. The control circuit 101 then serially reads the data from the shift register 104 and transmits it to the multiplex transmission line 2 as the transmission signal TXD. As the address assigned to the reception signal RXD is directly assigned to the transmission signal TXD before being transmitted at this time, the CCU 1 fetches the transmission signal TXD with the address conforming to what has been transmitted by itself. One cycle of data transfer is, thus, completed under the half-duplex system.

The CCU 1 transmits data to the following LCU in this way and, by repeating the data transmission, effects the data transfer periodically between itself and the plurality of LCUs 11–14 to render multiplex transmission possible.

Figure 6:
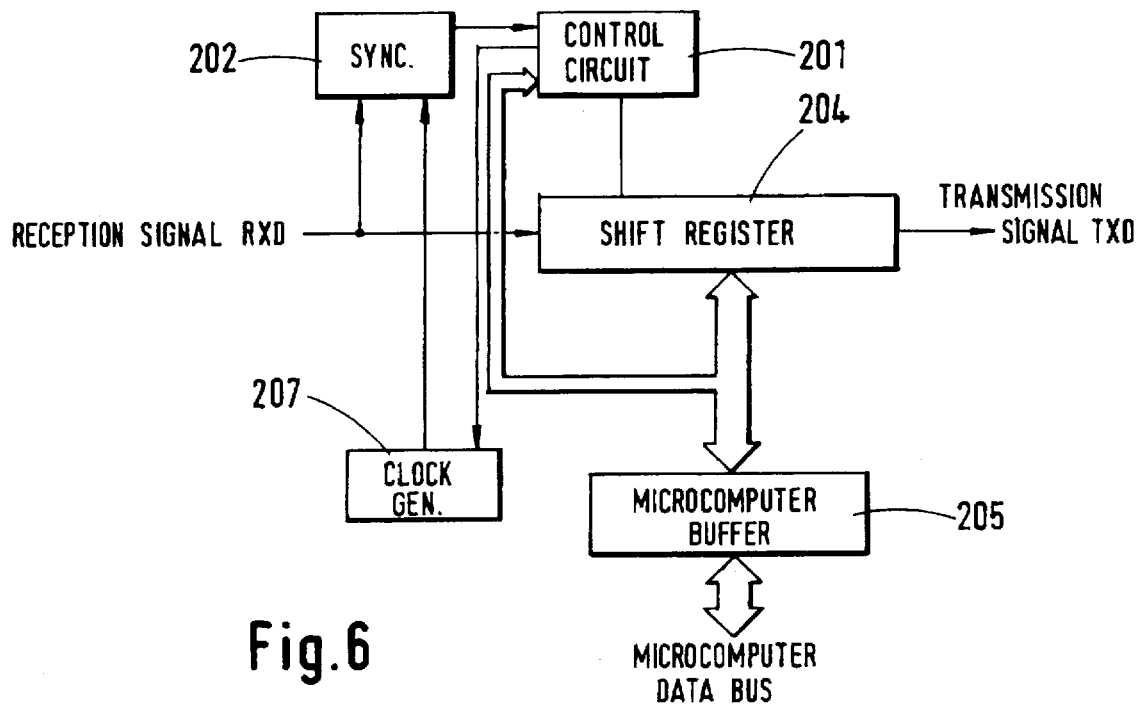
FIG. 6 shows a block diagram illustrating a communication interface adaptor in detail.

FIG. 6 is a schematic block diagram illustrating a communication interface adapter (CIM) 40, by way of example. The CIM 40 and the microcomputer 41 are connected via a data bus.

One part of the input-output of the data bus is used for data, whereas the remaining part is used for a control signal for partly controlling the CIM 40. The microcomputer 41 is adapted for use in gaining access to a shift register 204 via a microcomputer buffer 205.

On the other hand, a control circuit 201 receives a control signal from the microcomputer and enacts about a transmitting operation simultaneously when data from the microcomputer 41 is stored, the transmission of a transmission frame being started after the data is completely stored therein.

When the transmission frame is thus transmitted from the CIM 40, one of the LCUs 11–14 on the LCU side responds accordingly and the LCU subsequently keeps transmission. Therefore, the data transmitted from the LCU in response to a call from the CIM 40 is completely stored in the shift register 204.

The control circuit 201 of the CIM 40 issues an interrupt request IRQ to the microcomputer 41 at this point of time and the microcomputer 41 reads the data in the shift register 204. The data transmission is thus terminated.

Moreover, a clock generator 207 is so arranged as to suspend output when the CIM 40 enters the sleep mode. When the microcomputer 41 produces a signal for instructing the control circuit 201 to enter the sleep mode via the microcomputer buffer 205, the control circuit 201 works upon the clock generator 207 to suspend its oscillating output operation.

When the microcomputer 41 applies to the control circuit 201 a signal for releasing the sleep mode while the CIM 40 is in the sleep mode, the control circuit 201 works upon the clock generator 207 to restart the oscillating output operation, whereby the control circuit 201 returns to the normal control condition.

Figure 7:
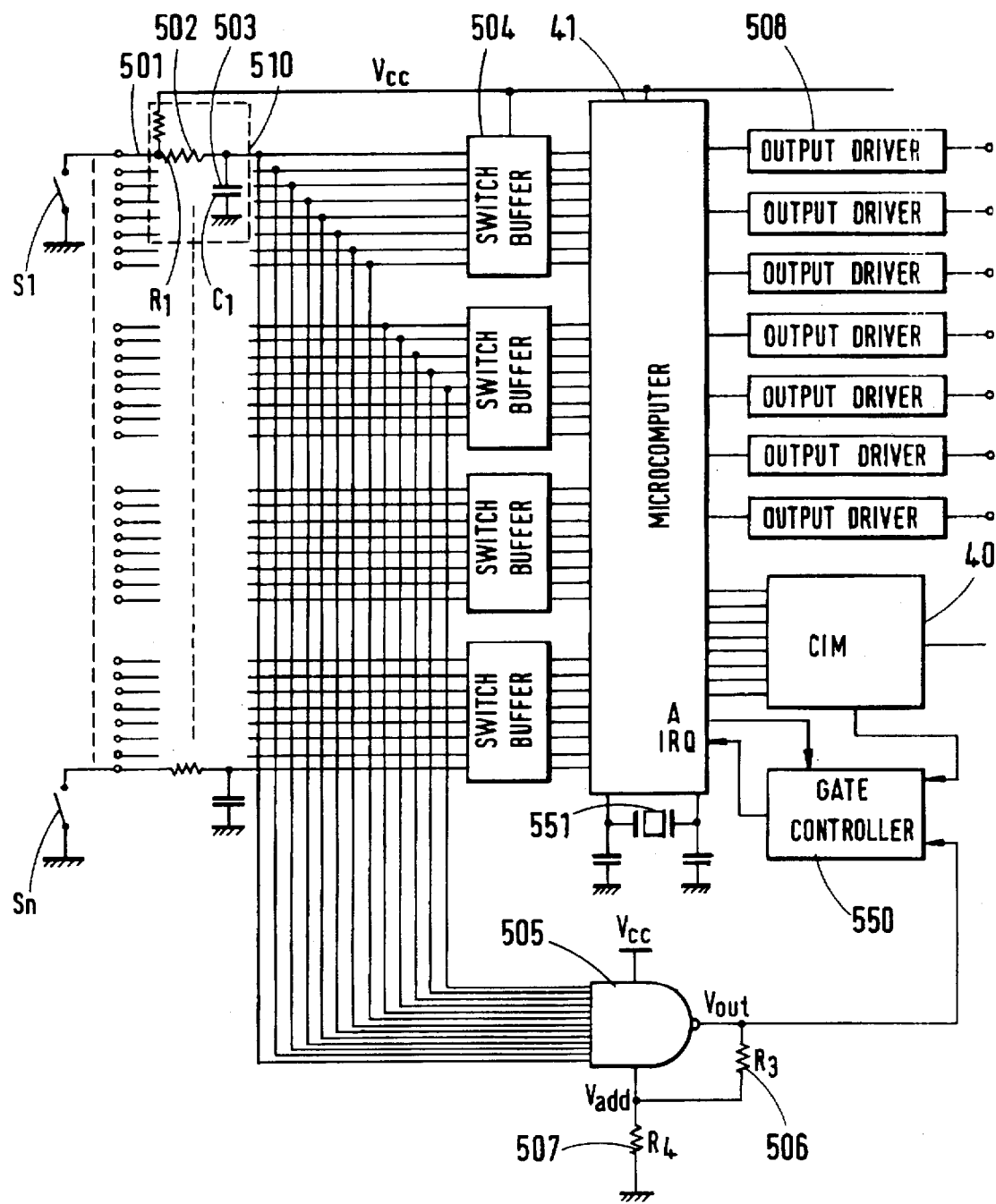
FIG. 7 shows a block diagram illustrating a central control unit in detail and a switching state detecting apparatus in accordance with this invention.

FIG. 7 is a detailed block diagram of the CCU 1. An input signal varying stepwise between ground potential and Vcc (0 V and 5 V) for each switch S1 to Sn is applied via a terminal 501. The input signal for the respective switches is first input to a switch buffer 504 via a passive filter, for example, an RC filter, 510, incorporating a resistor 502 ($R_1$=47 k$\Omega$) and a capacitor 503 ($C_1$=0.022 µF) and subsequently fetched by the microcomputer 41.

By controlling an output driver 508, the microcomputer 41, for example, turns ON/OFF the lamp 24 connected to the output of the output driver 508.

As described above, the LCUs 11–14 and the CIM 40 are designed to enter the sleep mode under instructions from the microcomputer 41. The microcomputer 41 suspends its own clock 551 oscillation and enters the sleep mode likewise after instructing the LCUs 11–14 and the CIM 40 to enter the sleep mode when it determines that predetermined conditions have been met. Incidentally, the microcomputer 41 returns from the sleep mode when a signal is applied to its interrupt request terminal (IRQ) and moves to assume normal control. A detailed description will be given of this process hereinafter.

The ON/OFF signals of the switch that have been filtered through the RC filter 510 are input to a comparator formed by a NAND gate 505. In this case, use can be made of HD74HC30 of Hitachi, Ltd., for instance. The output of the NAND gate 505 is connected to the interrupt terminal IRQ of the microcomputer 41.

Voltage Vcc is connected to the power input terminal of the NAND gate 505, whereas the ground potential terminal thereof is grounded via a resistor 507. Moreover, a junction between the ground potential terminal of the NAND gate 505 and the resistor 507 is connected via a resistor 506 to the output of the NAND gate 505.

When voltage at any one of the input terminals of the NAND gate 505 becomes lower than the threshold level voltage, the NAND gate 505 outputs a predetermined output voltage Vout. The threshold level is determined in accordance with the voltage Vcc applied to the power input terminal of the NAND gate 505. Although the power input terminal potential herein is Vcc, it could, alternatively, be some other potential, as required.

Figure 8A:
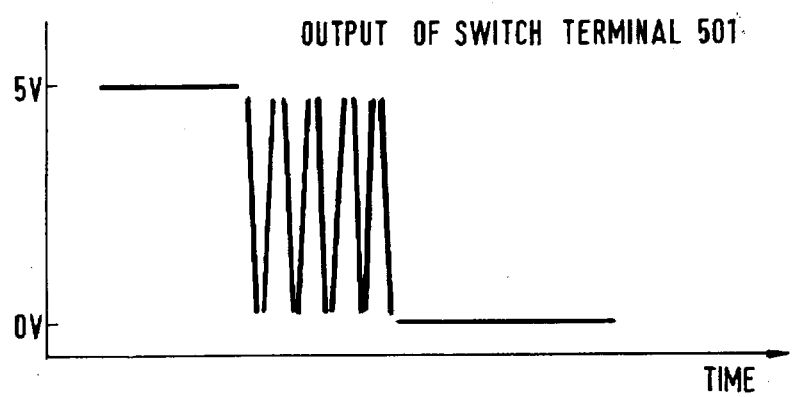
FIG. 8(a) shows an output waveform chart illustrating an output of a switch terminal.

Referring to the output waveform charts of FIG. 8, the operation of the NAND gate 505 will be described. When the switch is changed from an OFF to an ON state, the voltage applied to the switch terminal 501 is changed from a high to a low level stepwise several times. The low level condition settles some time after the oscillatory variations (FIG. 8(a)). As the voltage applied to the switch terminal 501 changes, the output of the RC filter 510 incorporating the resistor 502 and the capacitor 503 decreases with chattering in proportion to the time constant determined by the physical quantity of the resistor 502 and the capacitor 503 (FIG. 8(b)).

When the output voltage of the RC filter 510 becomes lower than the threshold level determined by the power input terminal voltage Vcc of the NAND gate 505, the output voltage of the NAND gate 505 becomes high. However, as the output voltage of the RC filter 510 decreases with the chattering component contained therein, the output voltage value of the RC filter 510 crosses the threshold level more than once, assuming the threshold level to be fixed. For this reason, the output of the NAND gate 505 repeatedly inverts low-high, high-low over an extremely short time interval.

Figure 8B:
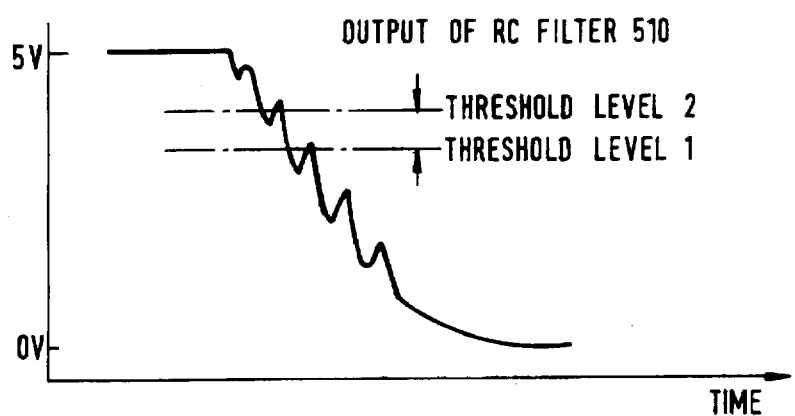
FIG. 8(b) shows an output waveform chart illustrating an output of an RC filter.
Figure 8C:
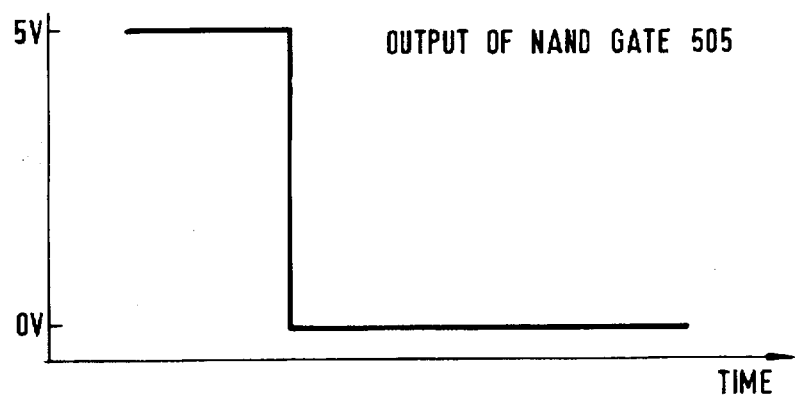
FIG. 8(c) shows an output waveform chart illustrating an output of a NAND gate.

With the use of the resistors 506, 507 in the embodiment shown, the output voltage of the NAND gate 505 is prevented from hunting by changing the threshold level, in the present embodiment 0.02 V, (FIG. 8(b)): threshold level 1→threshold level 2) when the output voltage of the NAND gate 505 changes from low to high.

The output of NAND gate 505 is applied via a gate controller 550, also having inputs from the CIM 40 and an A terminal of the microcomputer to the IRQ input of the microcomputer. If a sleep signal is output from terminal A, the gate controller 550 closes the path for Vout to the IRQ terminal, but if a wake-up signal is output from terminal A, then the path from the NAND gate output to the IRQ terminal is open circuited.

A more detailed description will now be given of variation in the threshold level of the NAND gate 505. When the output of the RC filter 510 decreases with chattering to the extent that it becomes lower than the threshold level 1 determined by the power input terminal voltage Vcc of the NAND gate 505, the output voltage of the NAND gate 505 changes from low to high (output voltage Vout). As the output voltage Vout of the NAND gate 505 changes, the value of the voltage Vadd (about 30 mV) at the ground terminal of the NAND gate divided by the resistor 506 ($R_3$=5.1 kΩ) and the resistor 507 ($R_4$=30 Ω) is superposed on the grounded terminal of the NAND gate 505. This is tantamount to the fact that the power input terminal voltage Vcc has risen. Accordingly, the threshold level is also likewise raised (threshold level 1→threshold level 2).

Figure 9:
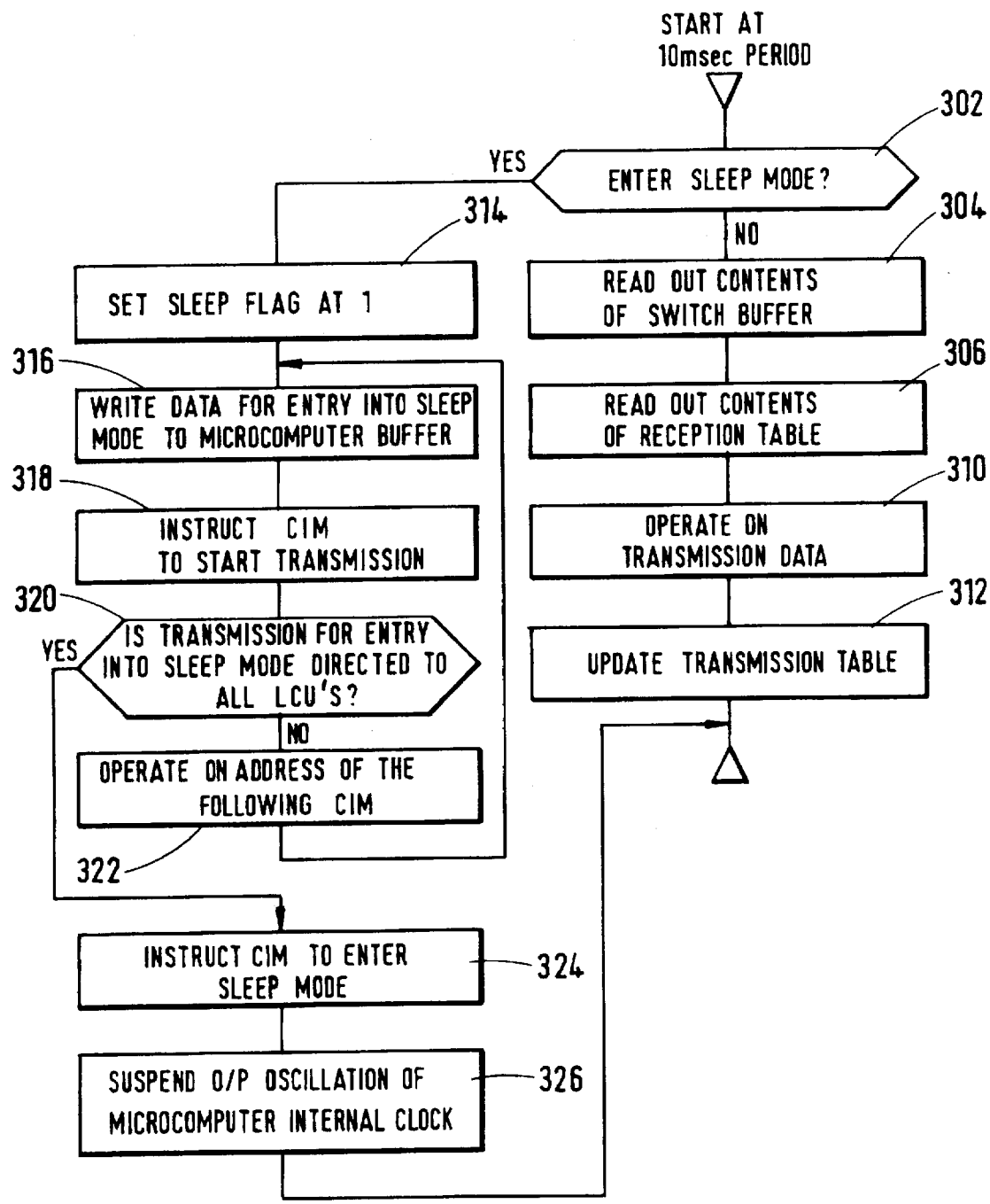
FIG. 9 shows a flowchart illustrating the operation of the microcomputer.

The operation of the microcomputer 41 will now be described by reference to flowcharts shown in FIGS. 9, 10 and the data table of FIG. 11. The operation shown in FIG. 9 is performed every 10 msec. First, a decision is made on whether entry into the sleep mode is fulfilled at Step 302. Requirements for entry into the sleep mode include a state in which an engine is left inoperative over a long time interval and so forth. Unless a decision is made on entry into the sleep mode at Step 302, the contents of the switch buffer 504 are read at Step 304. A reception table for reading the contents of reception data is provided corresponding to the address of each LCU (FIG. 11, 222) and the reception data is accumulated therein. At Step 310, transmission data is operated according to the read contents of the switch buffer 504 and the reception table 222. A transmission table corresponds to the address of each LCU (221 in FIG. 11) and the transmission data is accumulated therein. At Step 312, the transmission data 221 is stored at a predetermined address and the operation shown in the flowchart is terminated.

When a decision is made on entry into the sleep mode at Step 302, a sleep flag is set at 1 at Step 314. The sleep flag is used to indicate that the whole system is in the sleep mode. At Step 316, data for entry into the sleep mode is written to the microcomputer buffer 205. On receiving the data, the LCUs 11–14 enter the sleep mode as described above. At Step 318, the CIM 40 is instructed to start transmission and the transmission signal TXD is sent from the shift register 204 to the multiple transmission line 2. At Step 316, a decision is made on whether transmission for entry into the sleep mode is directed to all the LCUs. When transmission for entry into the sleep mode has not been directed to all the LCUs, Step 316 is followed again and the operation of letting all the LCUs enter the sleep mode is repeated. When it is decided that transmission for entry into the sleep mode has been directed to all the LCUs at Step 320, the CIM 40 is instructed to enter the sleep mode at Step 324 and the internal clock 551 of the microcomputer 40 suspends oscillations at Step 326 to terminate the operation indicated in this flowchart.

Figure 10:
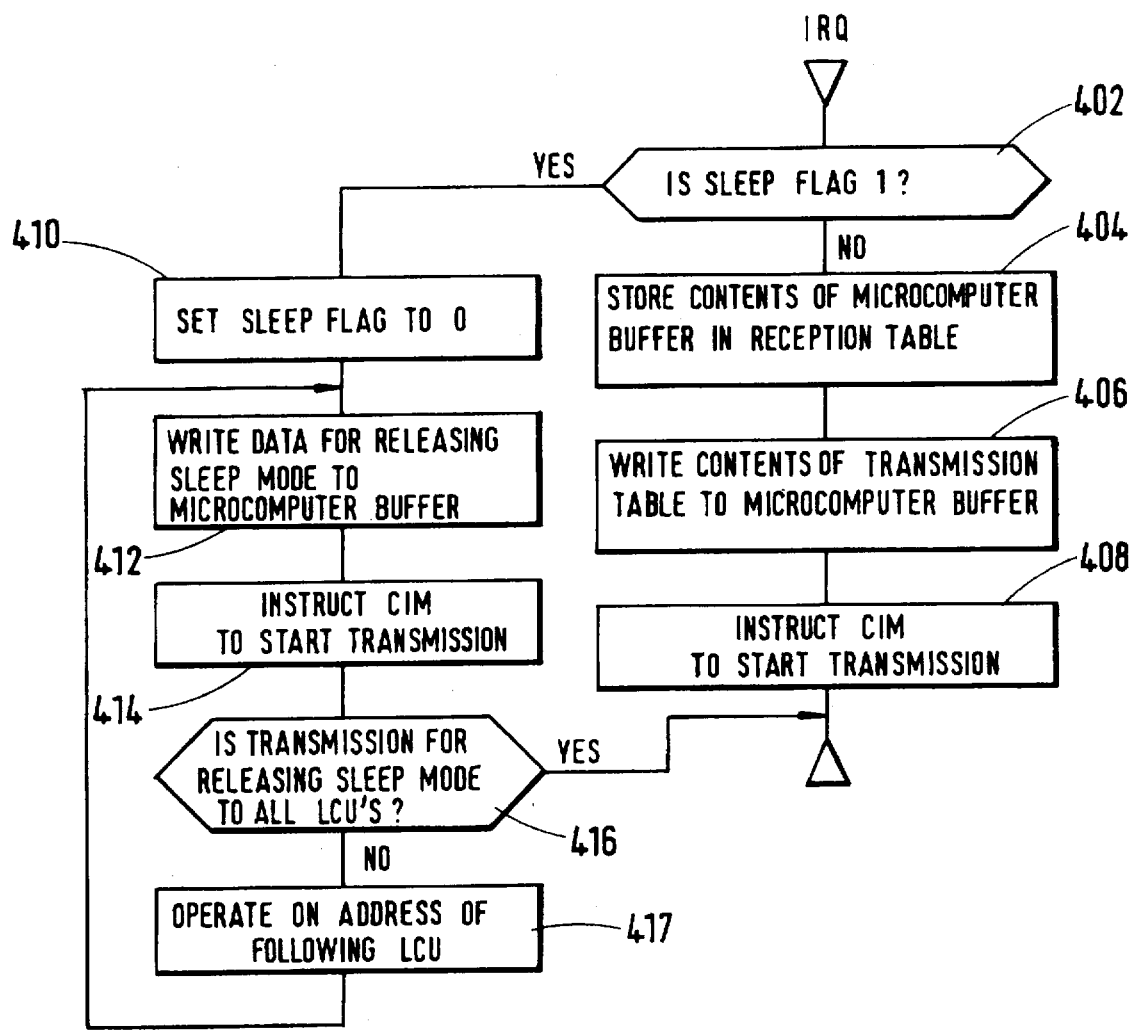
FIG. 10 shows a flowchart illustrating the operation of the microcomputer.
Figure 11:
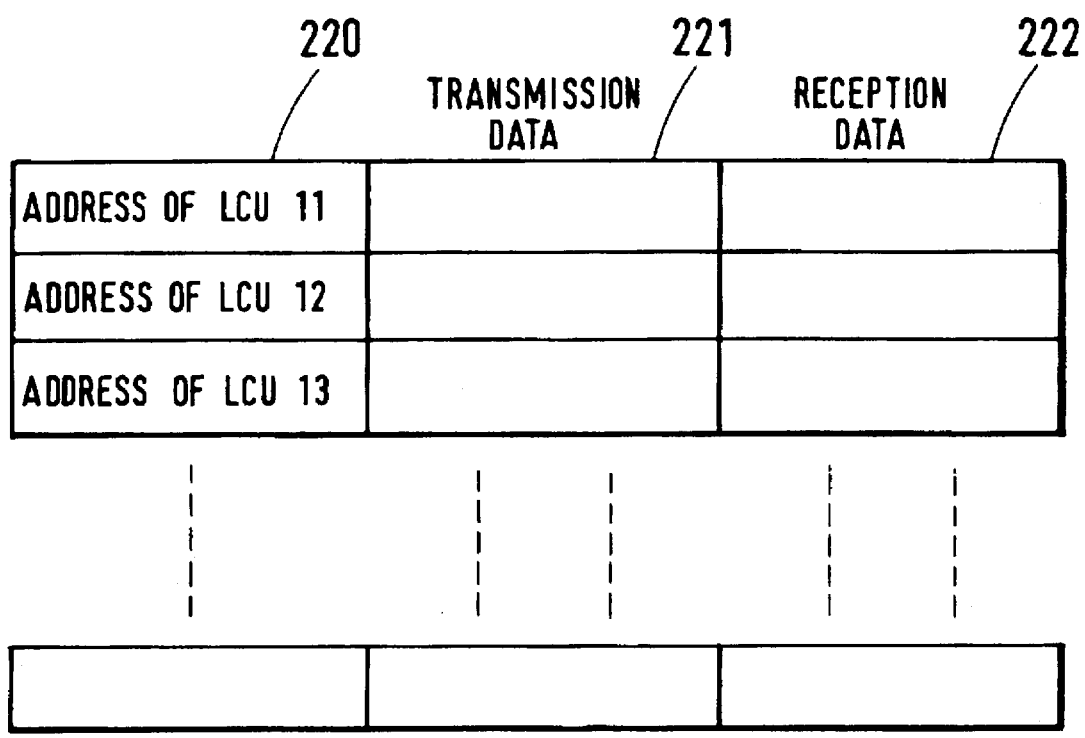
FIG. 11 shows a data table.

The operation shown in the flowchart of FIG. 10 is performed when a signal is input to the IRQ terminal of the microcomputer 41. First, a decision is made on whether the sleep flag is 1 at Step 402. Unless the sleep flag is 1, the signal is an interrupt signal due to the completion of reception of the signals by the CIM 40 from the respective LCUs 11–14. Consequently, the operation of transmitting signals to the LCUs 11–14 is performed at Steps 404–408. In other words, the contents of the microcomputer buffer 205 are stored in the reception table 221 at Step 404 and the contents of the transmission table 221 are written to the microcomputer buffer 205 at Step 406. Further, the CIM 40 is instructed to start transmission at Step 408, whereby the predetermined transmission signal RXD is sent to the multiplex transmission line 2.

When the sleep flag is 1 at Step 402, on the other hand, this indicates the whole system has been maintained in the sleep mode up till then and the operation of releasing the sleep mode is performed at Steps 410–417. Assuming the sleep mode is to be released, the sleep flag is set at 0 at Step 410. Data for releasing the sleep mode is written to the microcomputer buffer 205 at Step 412 and the CIM 40 is instructed to start transmission at Step 414. A decision is made on whether transmission for releasing the sleep mode has been directed to all the LCUs at Step 411. When the transmission therefor has already been directed to all the LCUs, the operation indicated in this flowchart is terminated. When it is decided that the transmission for releasing the sleep mode has not yet been directed to all the LCUs, operations are performed on the address of the following LCU at Step 417. Then Step 412 is followed again and the same operation is repeated.

Figure 12:
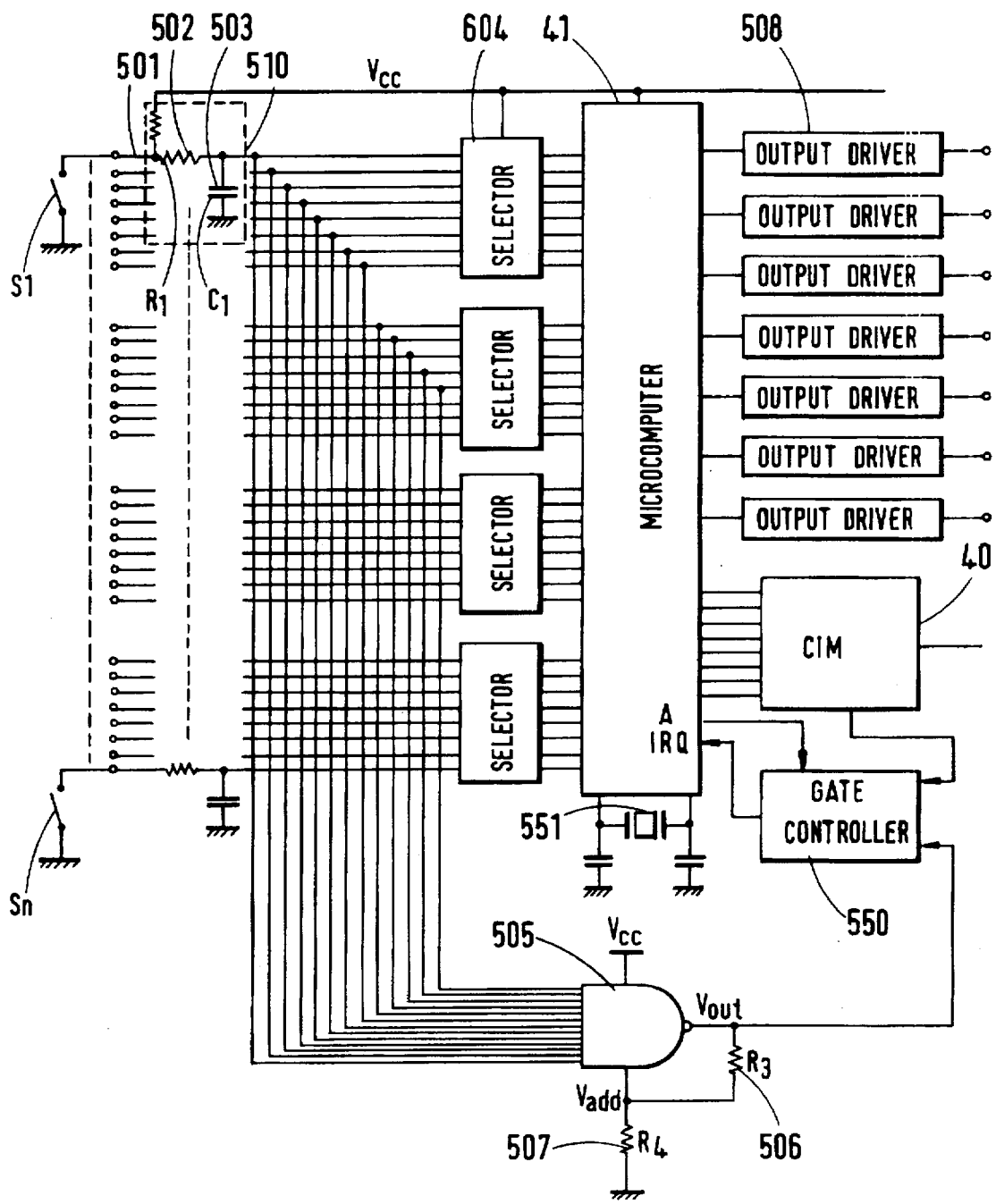
FIG. 12 shows a diagram illustrating a second embodiment using the present invention.

FIG. 12 illustrates a second embodiment. In this embodiment selectors 604 are provided, in place of switch buffers 504 for selecting a predetermined combination of inputs thereto and providing an output representative thereof in dependence upon control from microcomputer 41, the remaining parts being similar to those shown in the first embodiment.

As set forth above, the present invention makes it possible to implement the switching state detecting apparatus designed to inhibit output voltage hunting when a mechanical switch changes state.

The feature of the invention implements the control unit capable of assuming control stably with the microcomputer free from malfunction.

The another feature of the invention implements the transmission unit which ensures fetching of communication data from other control units.

It is to be understood that the invention has been described with reference to exemplary embodiments, and modifications may be made without departing from the spirit and scope of the invention as defined in the appended claims.

We claim:

1. A switching apparatus comprising:

switching means for selectively outputting as an output one of a first voltage value and a second voltage value at a time, a passive filter receiving said output of said switching means for providing an output value dependent upon said output of said switching means, comparator means for comparing said output value of said passive filter with a predetermined reference voltage value and providing a bi-state output voltage therefrom, said comparator means changing said reference voltage value from a first threshold value to a second threshold value when said output voltage of said comparator means changes from one state to another state for preventing said comparator means output voltage from hunting, and voltage divider means connected to provide voltage division of the output voltage of said comparator means, wherein an output voltage of said voltage divider means is superposed on said first threshold value to provide said second threshold value.

2. A switching apparatus as claimed in claim 1, and further comprising a plurality of switching means each individually connected to said comparator means via said passive filter, wherein said output voltage of said comparator means changes between said states when said output value of said passive filter caused by any one of said switching means exceeds said predetermined reference voltage value.

3. Switching apparatus as claimed in claim 1, wherein said comparator means is a NAND gate.

4. A switching apparatus comprising:

switching means having contact bounce when changing state and resultant fluctuation in an output voltage, a passive filter receiving said output voltage of said switching means for providing an output dependent upon said output voltage of said switching means, and a comparator means for comparing said output of said passive filter with a reference voltage and providing a bi-state output voltage in dependence thereon, said comparator means changing said reference voltage from a first threshold level to a second threshold level when said output voltage thereof changes state, said first and second threshold levels being spaced apart by more than said fluctuation of said output voltage of said switching means, and voltage divider means connected to provide voltage division of the output voltage of said comparator means, wherein an output voltage of said voltage divider means is superposed on said first threshold value to provide said second threshold value.

5. A transmission unit comprising:

switching means for selectively outputting as an output one of a first voltage value and a second voltage value at a time, a passive filter receiving said output of said switching means for providing an output value dependent upon said output of said switching means, comparator means for comparing said output value of said passive filter with a predetermined reference voltage value and providing a bi-state output in dependence thereon, said comparator means changing said reference voltage value from a first threshold level to a second threshold level when the output of said comparator means changes from one state to another state, voltage divider means connected to provide voltage division of the output of said comparator means, an output voltage of said voltage divider means being superposed on said first threshold value to provide said second threshold value, a microcomputer having an interrupt signal input receiving the output of said comparator means, said microcomputer controlling an element, and communication means for serially communicating with other control units via a multiplex transmission line, said communication means having means for deciding that reception has been made and for sending an acknowledgement signal to said interrupt signal input of said microcomputer, whereby said microcomputer assumes control of said controlled element in response to said acknowledgement signal.

6. A transmission unit as claimed in claim 5, wherein said serial communication is carried out under a half duplex system.

7. A transmission unit as claimed in claim 5 wherein said microcomputer has an interrupt signal input controlled by said output of said comparator means, and wherein said microcomputer has a clock generator and means for suspending and restarting said clock generator when a signal is applied to said interrupt signal input of said microcomputer.

* * * * *